(12) United States Patent
Ootomo et al.

(10) Patent No.: US 11,544,209 B2
(45) Date of Patent: Jan. 3, 2023

(54) SEMICONDUCTOR STORAGE DEVICE, MEMORY SYSTEM, AND METHOD

(71) Applicant: KIOXIA CORPORATION, Tokyo (JP)

(72) Inventors: Goichi Ootomo, Kawasaki Kanagawa (JP); Tomoaki Suzuki, Chigasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/463,456

(22) Filed: Aug. 31, 2021

(65) Prior Publication Data

US 2022/0300440 A1 Sep. 22, 2022

(30) Foreign Application Priority Data

Mar. 22, 2021 (JP) .............................. JP2021-047550

(51) Int. Cl.
*G06F 13/42* (2006.01)
*G06F 13/16* (2006.01)
*G11C 16/32* (2006.01)
*G06F 13/40* (2006.01)
*G11C 16/04* (2006.01)

(52) U.S. Cl.
CPC ...... *G06F 13/1689* (2013.01); *G06F 13/4027* (2013.01); *G06F 13/4291* (2013.01); *G11C 16/32* (2013.01); *G11C 16/0483* (2013.01)

(58) Field of Classification Search
None
See application file for complete search history.

(56) References Cited

U.S. PATENT DOCUMENTS

| 4,896,212 A | * | 1/1990 | Chantelou | H04N 7/012 375/240.21 |
| 8,966,208 B2 | | 2/2015 | Gillingham | |
| 9,352,929 B2 | | 5/2016 | Nomura | |

(Continued)

FOREIGN PATENT DOCUMENTS

| CN | 101394167 A | 3/2009 |
| JP | 2013520732 A | 6/2013 |

(Continued)

OTHER PUBLICATIONS

U.S. Appl. No. 17/121,204.

*Primary Examiner* — Henry Tsai
*Assistant Examiner* — Dean Phan
(74) *Attorney, Agent, or Firm* — Kim & Stewart LLP

(57) ABSTRACT

A semiconductor storage device includes a bridge chip and memory chips connected to the bridge chip by a plurality of channels. The bridge chip includes a first delay circuit for setting the start of a first timing signal for a first memory chip output via a first channel and a second delay circuit for setting the start of for second timing signal for a second memory chip output via a second channel. A controller on the bridge chip controls at least one of the first and second delay circuits to adjust the start time of at least one of the first and second timing signals such that data sequences from the first and second memory chips will be aligned in time. The controller combines the data sequence from the first memory chip with the data sequence from the second memory chip to generate an interleaved serial sequence.

20 Claims, 6 Drawing Sheets

(56) References Cited

U.S. PATENT DOCUMENTS

| | | | |
|---|---|---|---|
| 9,916,888 B1* | 3/2018 | Shin | G11C 29/12015 |
| 10,838,655 B2 | 11/2020 | Kobayashi et al. | |
| 2008/0298512 A1* | 12/2008 | Murakami | G06F 13/4059 |
| | | | 375/340 |
| 2009/0072871 A1 | 3/2009 | Tokuhiro | |
| 2014/0293705 A1 | 10/2014 | Gillingham | |
| 2019/0138220 A1* | 5/2019 | Hahn | G06F 3/0659 |
| 2020/0151119 A1 | 5/2020 | Huang et al. | |
| 2021/0294521 A1 | 9/2021 | Suzuki | |

FOREIGN PATENT DOCUMENTS

| | | |
|---|---|---|
| JP | 2013196476 A | 9/2013 |
| JP | 2019057344 A | 4/2019 |
| TW | 201506934 A | 2/2015 |
| TW | 202036301 A | 10/2020 |

\* cited by examiner

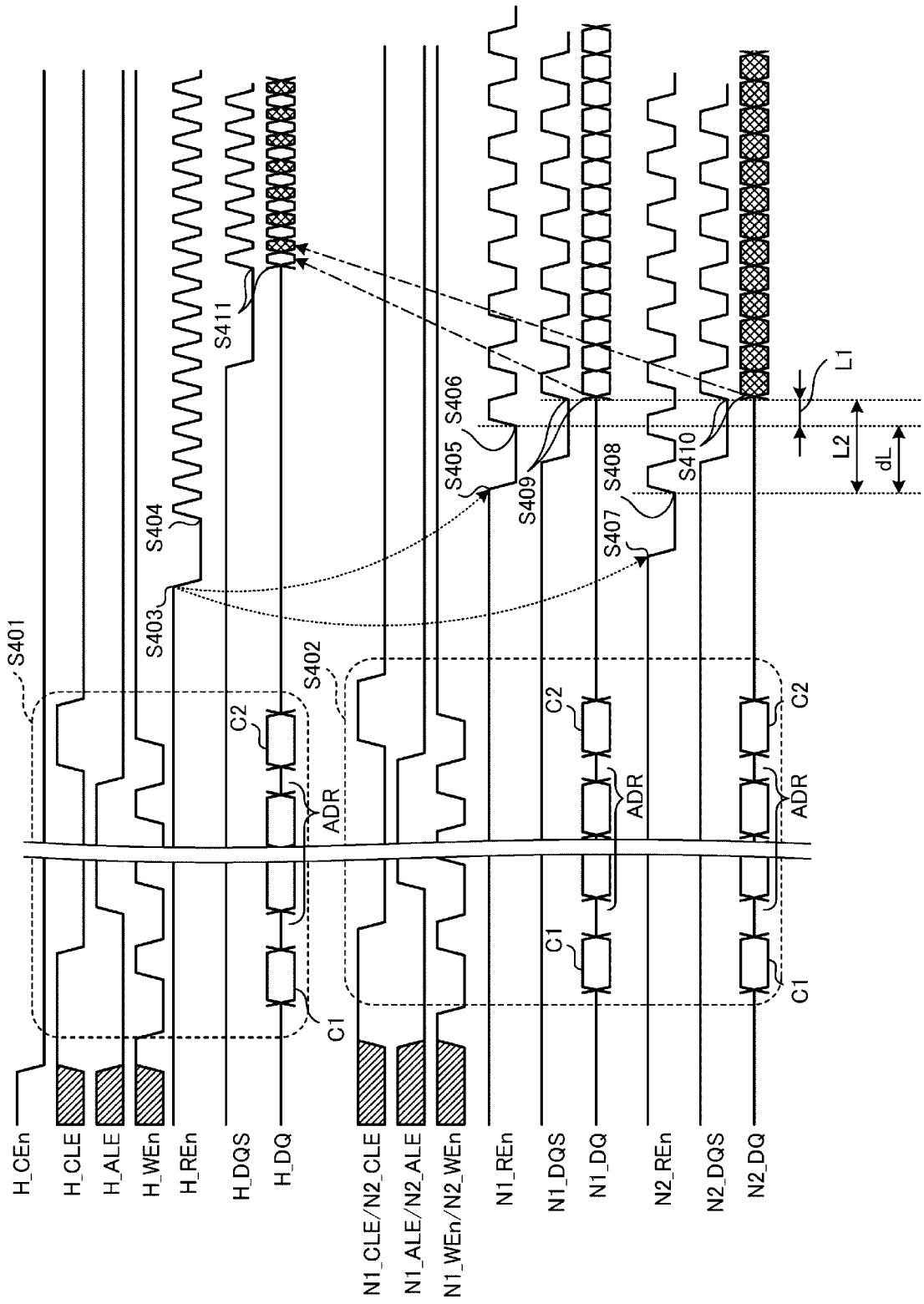

SEMICONDUCTOR STORAGE DEVICE, MEMORY SYSTEM, AND METHOD

CROSS-REFERENCE TO RELATED APPLICATION

This application is based upon and claims the benefit of priority from Japanese Patent Application No. 2021-047550, filed Mar. 22, 2021, the entire contents of which are incorporated herein by reference.

FIELD

Embodiments described herein relate generally to a semiconductor storage device, a memory system, and a method.

BACKGROUND

There is a semiconductor storage device in which a bridge chip is disposed between an external terminal group and a plurality of memory chips. In the semiconductor storage device, the external terminal group is connected to a host, and the host accesses the plurality of memory chips via the bridge chip.

BRIEF DESCRIPTION OF THE DRAWINGS

FIG. 6 is a timing chart showing waveforms of various signals in a parallel read operation of an embodiment.

DETAILED DESCRIPTION

Figure 1:
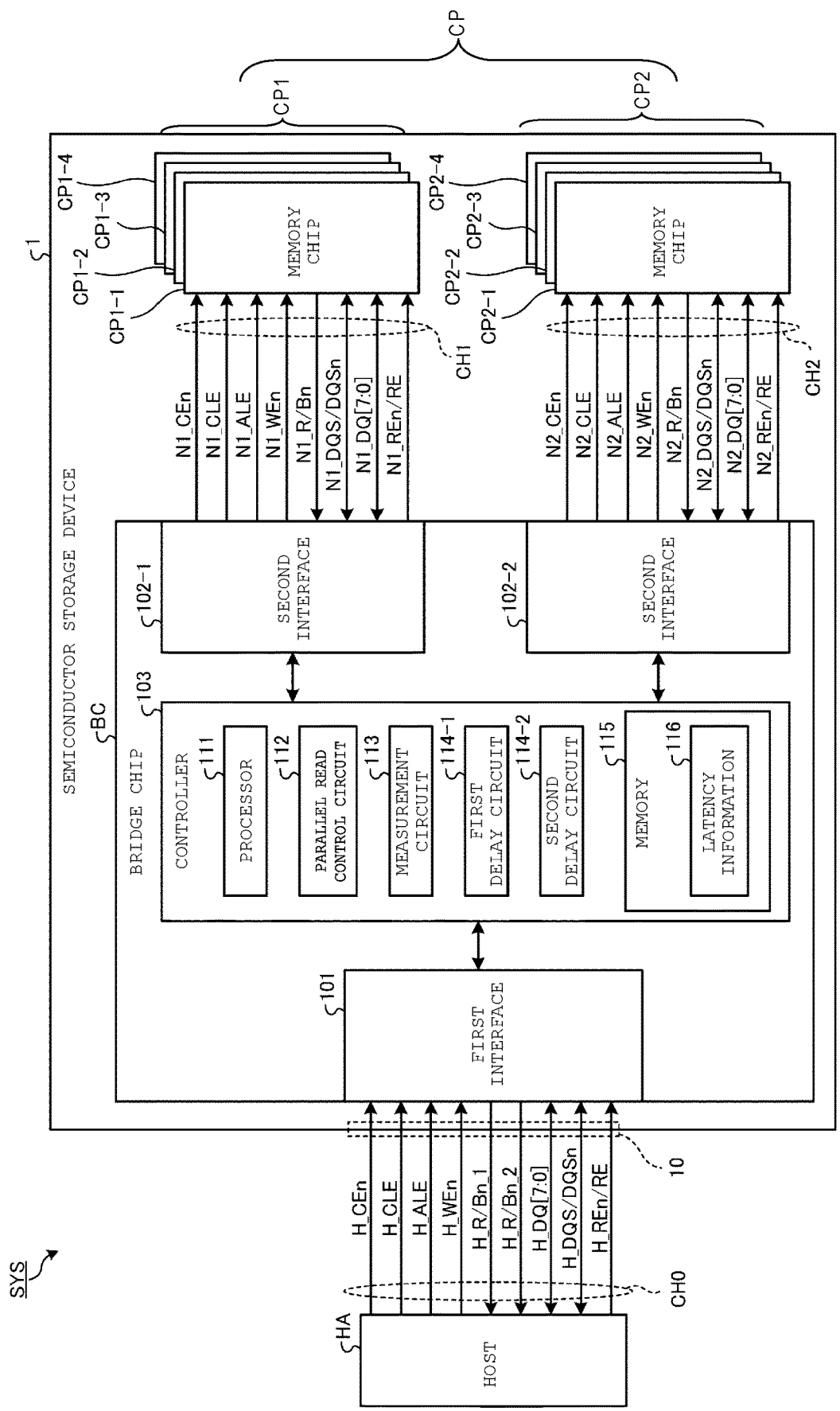
FIG. 1 is a schematic diagram of a storage system of an embodiment.

One embodiment provides a semiconductor storage device capable of suitably controlling a timing of reception start of data from two or more memory chips, a memory system including a semiconductor storage device, and a method.

In general, according to one embodiment, a semiconductor storage device includes a bridge chip with an external terminal group and a plurality of memory chips. The bridge chip configured to be connected to a host. The plurality of memory chips includes a first memory chip connected to the bridge chip by a first channel and a second memory chip connected to the bridge chip bay a second channel. The bridge chip includes a first delay circuit and a second delay circuit. The first delay circuit on the bridge chip is configured to set a transmission start timing for a first timing signal output to the first memory chip via the first channel. The first timing signal initiates transmission of a data sequence from the first memory chip via the first channel. The second delay circuit on the bridge chip is configured to set a transmission start timing for a second timing signal output to the second memory chip via the second channel. The second timing signal initiates transmission of a data sequence from the second memory chip via the second channel. A controller on the bridge chip is configured to: control at least one of the first and second delay circuits to adjust the transmission start timing of at least one of the first and second timing signals such that the data sequence from the first memory chip and the data sequence from the second memory chip will be aligned in time, and combine the data sequence from the first memory chip and the data sequence from the second memory chip into an interleaved serial sequence.

A semiconductor storage device, a memory system, and a method of certain example embodiments will be described with reference to the accompanying drawings. It is noted that the present disclosure is not limited to these example embodiments.

A memory system of an embodiment includes a host and a semiconductor storage device. The semiconductor storage device includes a bridge chip, a plurality of memory chips, and a plurality of channels. Each of the plurality of channels connects the bridge chip and one or more memory chips among the plurality of memory chips.

The plurality of memory chips are connected to the host via the bridge chip. The memory chip is, for example, a memory chip of a nonvolatile memory type such as a NAND flash memory. When the memory chip is a NAND flash memory, the standard of an interface for connecting the plurality of memory chips and the bridge chip is, for example, a toggle double-data-rate (DDR) standard.

In semiconductor storage devices, the number of memory chips provided is increasing in order to expand the memory capacity of the memory system. In order to reduce the electrical load applied to the connection with each of memory chips, a vendor or manufacturer of the semiconductor storage device disposes a bridge chip between the host and the plurality of memory chips. Such a bridge chip can be configured to enable a parallel read operation in which data is read in parallel from two or more memory chips connected to the bridge chip via different channels.

For example, in the toggle DDR standard, when data is output from the memory chips, a read enable signal, which is a timing signal for a data output, is input to the memory chips. The memory chips output data and a data strobe signal in response to the read enable signal. The data strobe signal is output in synchronization with the data. The data strobe signal can be generated by executing a process such as waveform shaping with respect to the received read enable signal. The period from when the transmission of the read enable signal to the memory chips is started until when the reception of the data strobe signal (or data) from the memory chips is started is referred to as an "RE latency."

Variations in RE latency can be generated for each of the memory chips. Therefore, in a parallel read operation, when the bridge chip starts transmitting the read enable signal to memory chips at the same time, there may be variations in the time until the bridge chip begins reception of data from each of memory chips.

In the present embodiment, the bridge chip does not start transmitting the read enable signal to each of memory chips at the same time, but adjusts the transmission start of the read enable signal for each channel by using a delay circuit. As a result, the timing of the start of data reception start from each of the plurality of memory chips can be synchronized. Thereby, the parallel read operation of the present embodiment facilitates the handling of data acquired in parallel from a plurality of memory chips.

Example details of a memory system of an embodiment will be described below regarding an example of how to handle data acquired in parallel from a plurality of memory chips by a parallel read operation.

FIG. 1 is a schematic diagram showing a storage system SYS of an embodiment.

The storage system SYS includes a host HA and a semiconductor storage device 1. The semiconductor storage device 1 includes an external terminal group 10, a bridge chip BC, and a plurality of memory chips CP. Each of the memory chips CP is a nonvolatile memory chip, such as a NAND flash memory. The bridge chip BC is an example of a first chip. Each of the plurality of memory chips CP is an example of a second chip.

The plurality of memory chips CP are connected to the bridge chip BC via two or more channels that are configured based on the predetermined standard. The present example has eight memory chips CP (CP1-1, CP1-2, CP1-3, CP1-4 and CP2-1, CP2-2, CP2-3, CP2-4). The four memory chips CP1-1 to CP1-4 are connected to the bridge chip BC via a channel CH1. The four memory chips CP2-1 to CP2-4 are connected to the bridge chip BC via a channel CH2. When each of the memory chips CP is a NAND flash memory, the predetermined standard is, for example, a toggle DDR standard. In the following, each of the memory chips CP connected to the channel CH1 may be referred to as a memory chip CP1. Each of the memory chips CP connected to the channel CH2 may be referred to as a memory chip CP2.

The host HA may be a device such as a controller, or may be a processor that is provided in an electronic device such as a computer or a mobile terminal. The host HA controls the semiconductor storage device 1. The semiconductor storage device 1 can be connected to the host HA via a wired communication channel CH0 (for example, a serial bus). In the present example, the semiconductor storage device 1 and the host HA are connected via a wired communication channel CH0 that is configured based on the predetermined standard. When each of the memory chips CP1-1 to CP1-4 and CP2-1 to CP2-4 is a NAND flash memory, the predetermined standard is, for example, a toggle DDR standard. For example, the wired communication channel CH0 functions as a toggle DDR interface.

The bridge chip BC is electrically connected to the external terminal group 10 that is configured to be connected to the host HA. The host HA and the external terminal group 10 are connected to one another by the channel CH0.

In the following examples, unless otherwise notes, it can be assumed that each of the memory chips CP is a NAND type flash memory, and each of the channels CH0, CH1, and CH2 conforms to the toggle DDR standard.

Each of the channels CH0, CH1, and CH2 includes a signal line for a chip enable signal CEn, a signal line for a command latch enable signal CLE, a signal line for an address latch enable signal ALE, a signal line for a write enable signal WEn, a signal line for a ready busy signal R/Bn, a signal line for a data signal DQ [7:0] having a particular bit width (here, a width of 8 bits is used), a signal line for a data strobe signal DQS/DQSn, and a signal line for a read enable signal REn/RE. The "n" at the end of the label representing a signal indicates that the signal is operated by a negative logic. Any design can be used to determine whether each signal is operated with a negative logic or a positive logic.

It should also be noted that in FIG. 1, the prefix "H_" is added to the beginning of the name of each of the signals being transferred on the channel CH0 in order to distinguish among the signals otherwise having the same name on the three channels. Similarly, the prefix "N1_" is added to the beginning of the name of the signals being transferred on the channel CH1. Likewise, the prefix "N2_" is added to the beginning of the name of the signals being transferred on the channel CH2.

The chip enable signal CEn is a signal to set a memory chip CP to be accessed to an enable (enabled) state. The command latch enable signal CLE is a signal indicating that the data signal DQ [7:0] is a command. The address latch enable signal ALE is a signal indicating that the data signal DQ [7:0] is an address. The write enable signal WEn is a signal instructing a partner device so as to capture a command or an address transmitted by the data signal DQ [7:0]. The ready busy signal R/Bn is a signal indicating either a ready state (Ry), which is a state of waiting for the reception of a command, or in a busy state (By), which is a state in which a previously received command is being executed.

It is noted that the channel CH0 is somewhat different from the channel CH1 and the channel CH2 as it includes a signal line for a ready busy signal H_R/Bn_1, which is a ready busy signal N1_R/Bn, and a signal line for a ready busy signal H_R/Bn_2, which is a ready busy signal N2_R/Bn, rather than just one signal line for a ready busy signal R/Bn. The configuration of the signal line for the ready busy signal R/Bn, which is included in the channel CH0, is not limited to the above example. For example, the channel CH0 may include just one signal line for transferring a ready-busy signal R/Bn, which is generated from both the ready-busy signal N1_R/Bn and the ready-busy signal N2_R/Bn by using a wire connection or the like, as a ready-busy signal H_R/Bn.

The data strobe signal DQS/DQSn is a signal instructing the partner device so as to capture the data transmitted by the data signal DQ [7:0]. The data strobe signal DQS/DQSn is a differential signal comprised of a pair of signals (a data strobe signal DQS and a data strobe signal DQSn). The read enable signal REn/RE is a signal instructing the partner device so as to output the data signal DQ [7:0], and is a timing signal for data output. The read enable signal REn/RE is a differential signal comprised of a pair of signals (a read enable signal RE and a read enable signal Ren).

In the following, for the sake of simplicity, regarding the data strobe signal DQS/DQSn, the separate description of the data strobe signal DQSn will be omitted and just the corresponding data strobe signal DQS will be described since these signals are simply the inverse of one another. Likewise, for the read enable signal REn/RE, the description of the read enable signal RE will be omitted, and only the read enable signal REn will be described.

The bridge chip BC includes a first interface 101, two second interfaces 102-1 and 102-2, and a controller 103.

The first interface 101 is a PHY circuit (physical layer circuit) that communicates an electric signal with the host HA via the channel CH0.

The second interface 102-1 is a PHY circuit that communicates an electric signal with the four memory chips CP1 via the channel CH1. The second interface 102-2 is a PHY circuit that communicates an electric signal with the four memory chips CP2 via the channel CH2.

The controller 103 is disposed between the first interface 101 and the two second interfaces 102-1, 102-2. The controller 103 controls the transmission and reception of signals between the first interface 101 and the two second interfaces 102-1, 102-2.

The controller 103 includes a processor 111, a parallel read control circuit 112, a measurement circuit 113, a first delay circuit 114-1, a second delay circuit 114-2, and a memory 115.

The parallel read control circuit 112 divides the frequency of the read enable signal H_REn received from the channel CH0 by ½ during the parallel read operation. The read enable signal REn divided by the parallel read control circuit 112 is then input to both the first delay circuit 114-1 and the second delay circuit 114-2.

The first delay circuit 114-1 delays the read enable signal REn by an amount set in advance and then outputs the delayed signal. The read enable signal REn from the first delay circuit 114-1 is supplied to the channel CH1 as a read enable signal N1_REn.

The second delay circuit 114-2 also delays the read enable signal REn by an amount set in advance and then outputs this delayed signal. The read enable signal REn from the second delay circuit 114-2 is supplied to the channel CH2 as a read enable signal N2_REn.

The parallel read control circuit 112 combines data sequences received in parallel from the channel CH1 and the channel CH2 and generates one data sequence. The parallel read control circuit 112 outputs the generated data sequence at a transfer rate twice the transfer rate of the data sequence in each of the channel CH1 and the channel CH2. The data sequence output from the parallel read control circuit 112 is supplied to the channel CH0 as a data signal H_DQ [7:0].

Figure 2:
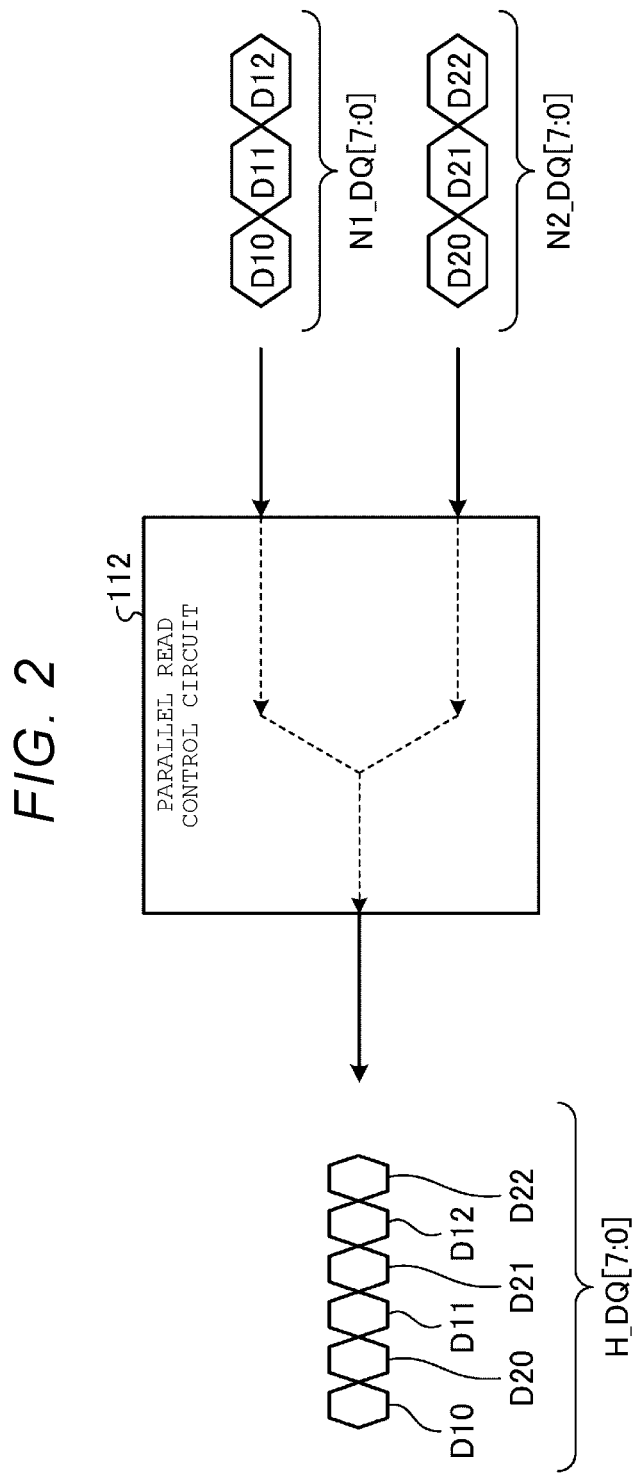
FIG. 2 is a schematic diagram depicting aspects related to a method of combining data sequences by a parallel read control circuit of an embodiment.

FIG. 2 is a schematic diagram for explaining a method of combining data sequences by a parallel read control circuit 112 of the embodiment. It is noted that in this figure, data "DX" (where X is an integer of 0 or more) is data of a unit of transfer. The data DX has the size of a bus width of the data signal DQ. In the example of the embodiment, the bus width of the data signal DQ is 8 bits, that is, 1 byte.

As depicted in FIG. 2, the bridge chip BC receives a first data sequence with data D10, data D11, and data D12 from the channel CH1 as the data signal N1_DQ [7:0]. In parallel with this, the bridge chip BC also receives a second data sequence with data D20, data D21, and data D22 from the channel CH2 as the data signal N2_DQ [7:0]. In this case, the parallel read control circuit 112 alternates acquiring data from these two data sequences in units of transfer of channels CH1 and CH2 (that is, 1 byte of data DX) (e.g., 1 byte from channel CH1, then 1 byte from channel CH2, then 1 byte from channel CH1, etc.), and then combines the acquired data DX in series in the order of acquisition. As a result, the parallel read control circuit 112 generates a data sequence with the data D10, the data D20, the data D11, the data D21, the data D12, and the data D22. That is, the first and second data sequences are interleaved with one another on an alternating byte (unit of transfer) basis. Thereafter, the parallel read control circuit 112 outputs the generated data sequence (the interleaved combination of the first and second data sequence) with the data D10, the data D20, the data D11, the data D21, the data D12, and the data D22. The parallel read control circuit 112 outputs this one combined data sequence at a frequency twice the transfer frequency of the two data sequences (the first and second data sequences) that were input via the different channels (CH1, CH2). As a result, the transfer rate of the data sequence after the combination is double the transfer rate of each of the two data sequences before the combination. After the combination of data sequences, the interleaved data sequence (combined data sequence) is transferred to the host HA via the host side channel CH0 as a data signal H_DQ [7:0].

According to the data combining method described above, it is required that the time at which the parallel read control circuit 112 starts acquiring the data sequence received from the channel CH1 and the time at which the parallel read control circuit 112 starts acquiring the data sequence received from the channel CH2 substantially match. However, as described above, since the RE latency may differ for each of the memory chips CP even if the bridge chip BC starts supplying the read enable signals REn to the two channels CH1 and CH2 at exactly the same time, the reception start time for the data sequences at the bridge chip BC may differ between channels CH1 and CH2. In such a case, in order to make the timing at which the parallel read control circuit 112 starts acquiring the data sequence received from the channel CH1 equal to the timing at which the parallel read control circuit 112 starts acquiring the data sequence received from the channel CH2, it would typically be necessary to allocate a FIFO (First In First Out) memory in the bridge chip BC, which would permit accumulation of the one of data sequences that is received earlier from the channel CH1 or channel CH2 while waiting for the start of reception of the other (more delayed) data sequence.

However, in the present embodiment, the bridge chip BC includes a first delay circuit 114-1 that can intentionally delay the timing of supplying the read enable signal N1_REn to the channel CH1 by a set amount and a second delay circuit 114-2 that can intentionally delay the timing of supplying the read enable signal N2_REn to the channel CH2 by a set amount. Thus, the bridge chip BC functions to absorb or otherwise account for the difference in RE latency between the different memory chips, such as the memory chip CP1 (a data output source) connected to the channel CH1 and the memory chip CP2 (a data output source) connected to the channel CH2 by adjusting the set amount of delay in the output of the read enable signal REn to the different memory chips using the first delay circuit 114-1 and the second delay circuit 114-2. Thereby, the time at which the bridge chip BC receives the data sequence from the channel CH1 and the time at which the bridge chip BC receives the data sequence from the channel CH2 can be made to match. Therefore, without requiring any timing adjustment or compensation using a FIFO memory or the like, it is possible to make the time at which the parallel read control circuit 112 starts acquiring the data sequence from the channel CH1 equal (substantially match or align with) the time at which the parallel read control circuit 112 starts acquiring the data sequence from the channel CH2.

It is noted that in the present embodiment, synchronizing or aligning (or equalizing) the time of reception start of the data sequence from the memory chip CP1 connected to the channel CH1 and the time of reception start of the data sequence from the memory chip CP2 connected to the channel CH2 means reducing the difference between the time of starting of reception of the data sequence from the memory chip CP1 and the time of starting of reception of the data sequence from the memory chip CP2 to the extent necessary for the parallel read control circuit 112 to execute the acquisition start of the data sequence input from the channel CH1 and the acquisition start of the data sequence input from the channel CH2 at the same time. As long as the parallel read control circuit 112 can execute the acquisition start of the data sequence input from the channel CH1 and the acquisition start of the data sequence input from the channel CH2 at the same time, the time of reception start of the data sequence from the memory chip CP1 and the time of reception start of the data sequence from the memory chip CP2 do not have to be exactly equal.

As depicted in FIG. 1, each of the first delay circuit 114-1 and the second delay circuit 114-2 is configured such that the amount of delay can be changed. The setting of the amount of delay for each of the first delay circuit 114-1 and the second delay circuit 114-2 is executed by the processor 111.

The processor 111 is, for example, a central processing unit (CPU). In some examples, the processor 111 may be implemented by a hardware circuit such as a field-programmable gate array (FPGA) or an application specific integrated circuit (ASIC).

The processor 111 analyzes a command received from the host HA via the channel CH0. The processor 111 can issue a command to the memory chips CP according to the analysis result.

When the command received from the host HA is a data output command, which is a command to the memory chips CP1 and CP2 to output data, the processor 111 specifies the memory chips CP1 and CP2 as the data output sources. The processor 111 sets the amount of delay in each of the first delay circuit 114-1 and the second delay circuit 114-2 based on the RE latency of each of the specified memory chips CP1 and CP2.

It is noted that the RE latency for each of the individual memory chips CP can be measured in a training process. More specifically, the host HA can issue a command (referred to as a training instruction) that instructs the execution of a training process to the bridge chip BC. The bridge chip BC starts the training process in response to the training instruction. In the training process, various measurements and various operation adjustments are executed. The training process includes measuring and storing the RE latency for each of the memory chips CP.

The measurement circuit 113 is a circuit for measuring the time length. The processor 111 measures the RE latency for each of the memory chips CP by using the measurement circuit 113 and records the measured value in the latency information 116. The latency information 116 is stored in the memory 115. The memory 115 is, for example, an SRAM or a register.

Figure 3:
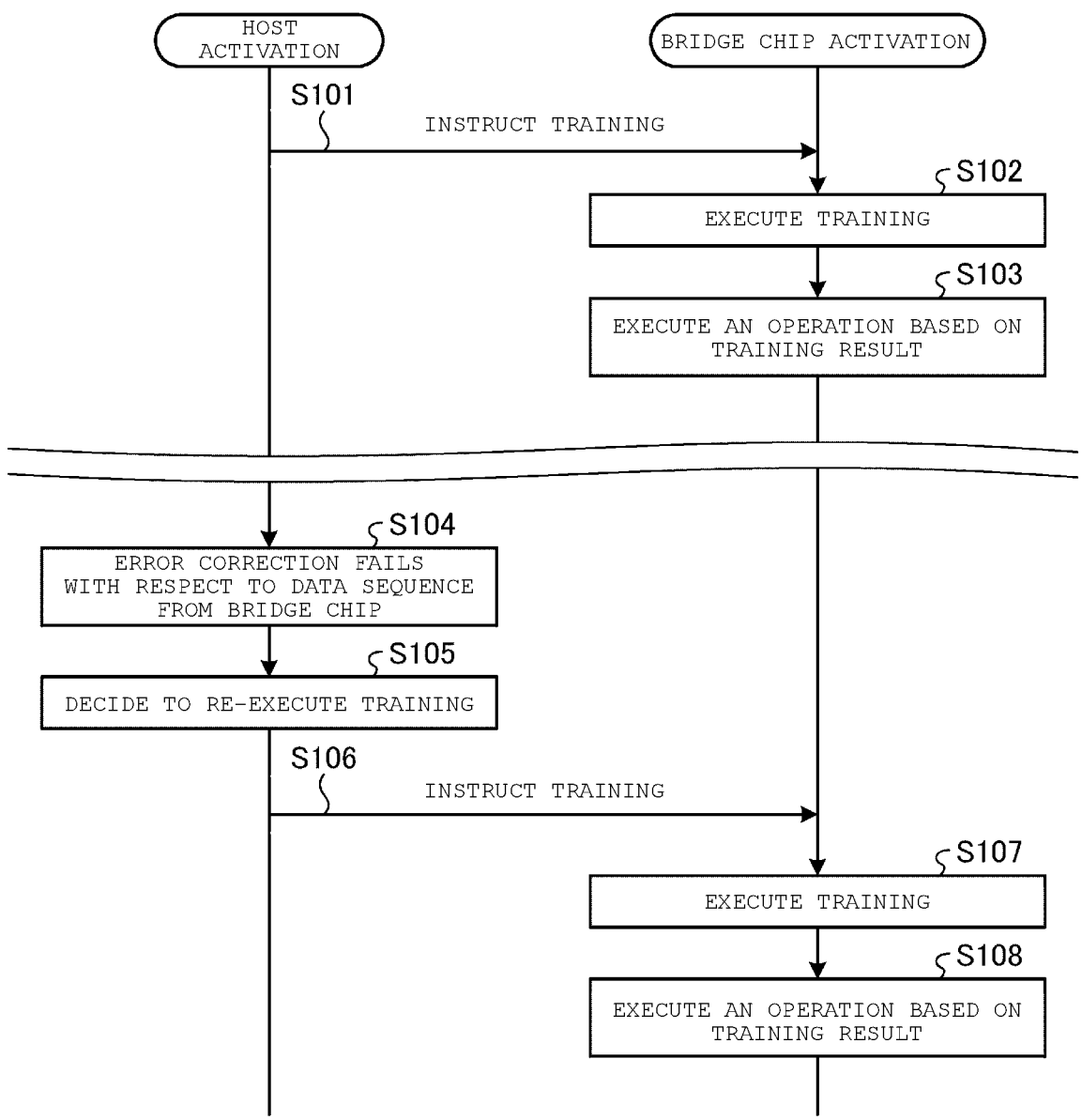
FIG. 3 is a sequence diagram for explaining an operation related to training in a memory system of an embodiment.

FIG. 3 is a sequence diagram for explaining an example of an operation related to a training process in a memory system SYS of an embodiment.

When the memory system SYS activates, each of the host HA and the bridge chip BC activates. When the host HA is first activated, the host HA transmits a training instruction to the bridge chip BC (S101). The bridge chip BC executes a training process (referred to as training) in response to the training instruction (S102). The bridge chip BC then executes an operation based on the training result (S103). For example, in the parallel read operation, the bridge chip BC performs adjustment of the timing of transmission start of the read enable signal REn by using the RE latency obtained for each of the memory chips CP in the training.

The RE latency of each of the memory chips CP can fluctuate with various changes such as temperature changes or fluctuations in supplied power supply voltage. When the RE latency of the memory chips CP deviates from the RE latency measured when the training was last executed, there may be a case where the timing of input start of the data sequence from the channel CH1 to the parallel read control circuit 112 and the timing of input start of the data sequence from the channel CH2 to the parallel read control circuit 112 do not match. Therefore, the memory system SYS can be configured to execute the training additional times after S103.

When the timing of input start of the data sequence from the channel CH1 to the parallel read control circuit 112 and the timing of input start of the data sequence from the channel CH2 to the parallel read control circuit 112 deviate from each other by a threshold value or more, the expected data sequence cannot be obtained by using the data combining method described with reference to FIG. 2. The host HA retransmits the training instruction, for example, when the data sequence received from the semiconductor storage device 1 as the data signal H_DQ [7:0] is different from the expected data sequence.

More specifically, the host HA performs error correction coding in advance on the data sequence to be stored in the semiconductor storage device 1. Thereafter, the host HA executes decoding by using the error correction code with respect to the data sequence received as the data signal H_DQ [7:0] from the semiconductor storage device 1. When the data sequence includes a minor error, the error can be corrected by the decoding. When the data sequence includes many errors that cannot be corrected by the error correction code, the error correction by decoding fails (S104). In such a case, the host HA can execute various processes including re-execution of the training process in order to acquire the expected data sequence. When the host HA decides to re-execute the training (S105), the host HA transmits a training instruction to the bridge chip BC (S106). The bridge chip BC executes the training in response to the training instruction (S107). The bridge chip BC then executes an operation based on the training result (S108). After S108, the processes of S104 to S108 can be executed one or more times.

It is noted that the trigger for re-execution of the training is not limited to the failure of error correction on the data sequence from the bridge chip BC. The host HA may decide to re-execute the training when the temperature of the memory system SYS or the fluctuation of the power supply voltage supplied to the semiconductor storage device 1 is detected by some method. Alternatively, the host HA may decide to re-execute the training on a particular cycle. Furthermore, the host HA may be configured to transmit a training instruction to the bridge chip BC, when the memory system SYS is in an idle state or the like.

Figure 4:
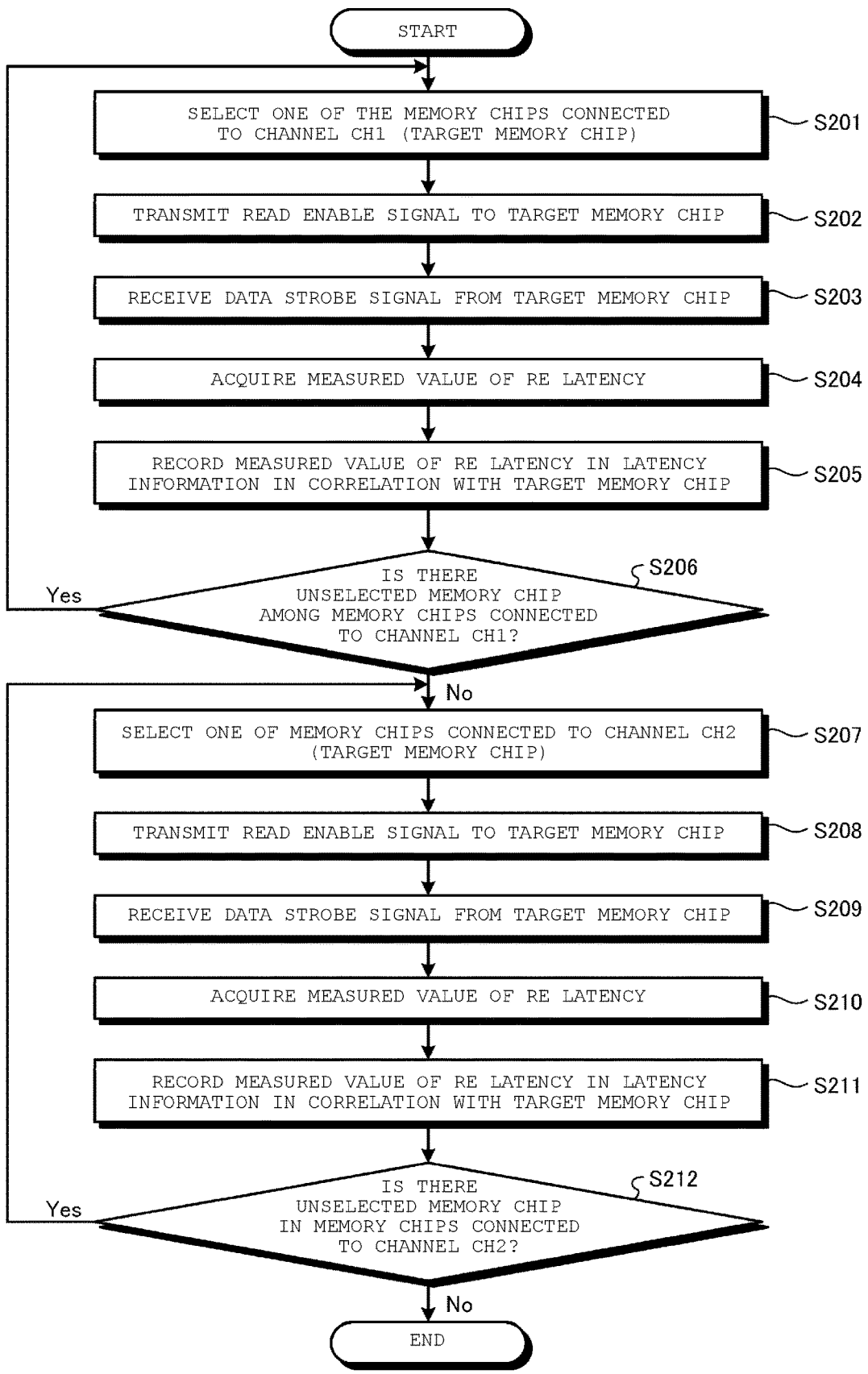
FIG. 4 is a flowchart of an operation of measuring an RE latency in a training by a bridge chip of an embodiment.

FIG. 4 is a flowchart showing an example of an operation of measuring an RE latency in the training by the bridge chip BC of the embodiment.

When the bridge chip BC receives a training instruction, the processor 111 interprets the training instruction and starts training. In the training, the processor 111 first selects one of the four memory chips CP1 connected to the channel CH1 (S201). The presently selected memory chip CP1 is referred to as a target memory chip CP1. The processor 111 transmits the read enable signal N1_REn to the target memory chip CP1 (S202). Sometime after the bridge chip BC transmits the read enable signal N1_REn to the target memory chip CP1, the bridge chip BC will receive the data strobe signal N1_DQS from the target memory chip CP1 (S203). The processor 111 causes the measurement circuit 113 to measure the time from the start of transmission of the read enable signal N1_REn to the target memory chip CP1, to the start of reception of the data strobe signal N1_DQS from the target memory chip CP1, this is the RE latency of the target memory chip CP1. After S203, the processor 111 acquires the measured value of the RE latency for the target memory chip CP1 from the measurement circuit 113 (S204). Thereafter, the processor 111 records the measured value of the RE latency of the acquired target memory chip CP1 in the latency information 116 in correlation with the target memory chip CP1 (S205).

Subsequently to S205, the processor 111 determines whether or not there is an unselected memory chip CP1 still among the four memory chips CP1 (S206). When there remains an unselected memory chip CP1 among the four memory chips CP1 (S206: Yes), control returns to S201, and the processor 111 selects one of the unselected memory chips CP1 as a new target memory chip CP1.

When there are no unselected memory chips CP1 among the four memory chips CP1 (S206: No), the processor 111 selects one of the four memory chips CP2 connected to the channel CH2 (S207). The presently selected memory chip CP2 is referred to as a target memory chip CP2. The processor 111 transmits the read enable signal N2_REn to the target memory chip CP2 (S208). Sometime after the bridge chip BC transmits the read enable signal N2_REn to the target memory chip CP2, the bridge chip BC receives the data strobe signal N2_DQS from the target memory chip CP2 (S209). The processor 111 causes the measurement circuit 113 to measure the time from the start of transmission of the read enable signal N2_REn to the target memory chip CP2 to the start of reception of the data strobe signal N2_DQS from the target memory chip CP2, this is the RE latency of the target memory chip CP2. After S209, the processor 111 acquires the measured value of the RE latency of the target memory chip CP2 from the measurement circuit 113 (S210). Thereafter, the processor 111 records the measured value of the RE latency of the acquired target memory chip CP2 in the latency information 116 in correlation with the target memory chip CP2 (S211).

Subsequently to S211, the processor 111 determines whether or not there is still an unselected memory chip CP2 among the four memory chips CP2 (S212). When there remains an unselected memory chip CP2 among the four memory chips CP2 (S212: Yes), control returns to S207, and the processor 111 selects one of the unselected memory chips CP2 as a new target memory chip CP2.

When there are no unselected memory chips CP2 among the four memory chips CP2 (S212: No), the series of operations for measuring the RE latency is ended.

By the above-described operation, the RE latency is measured for each of the memory chips CP, and the measured value of the RE latency for each of the memory chips CP is recorded in the latency information 116.

It is noted that in the example shown in FIG. 4, the measurement of the RE latency of all memory chips CP2 connected to the channel CH2 is executed after the measurement of the RE latency of all memory chips CP1 connected to the channel CH1 is executed. The order of measuring the RE latency is not limited to this. The bridge chip BC may be configured so as to execute the measurement of the RE latency of all memory chips CP1 connected to the channel CH1 and the measurement of the RE latency of all memory chips CP2 connected to the channel CH2 in parallel.

Figure 5:
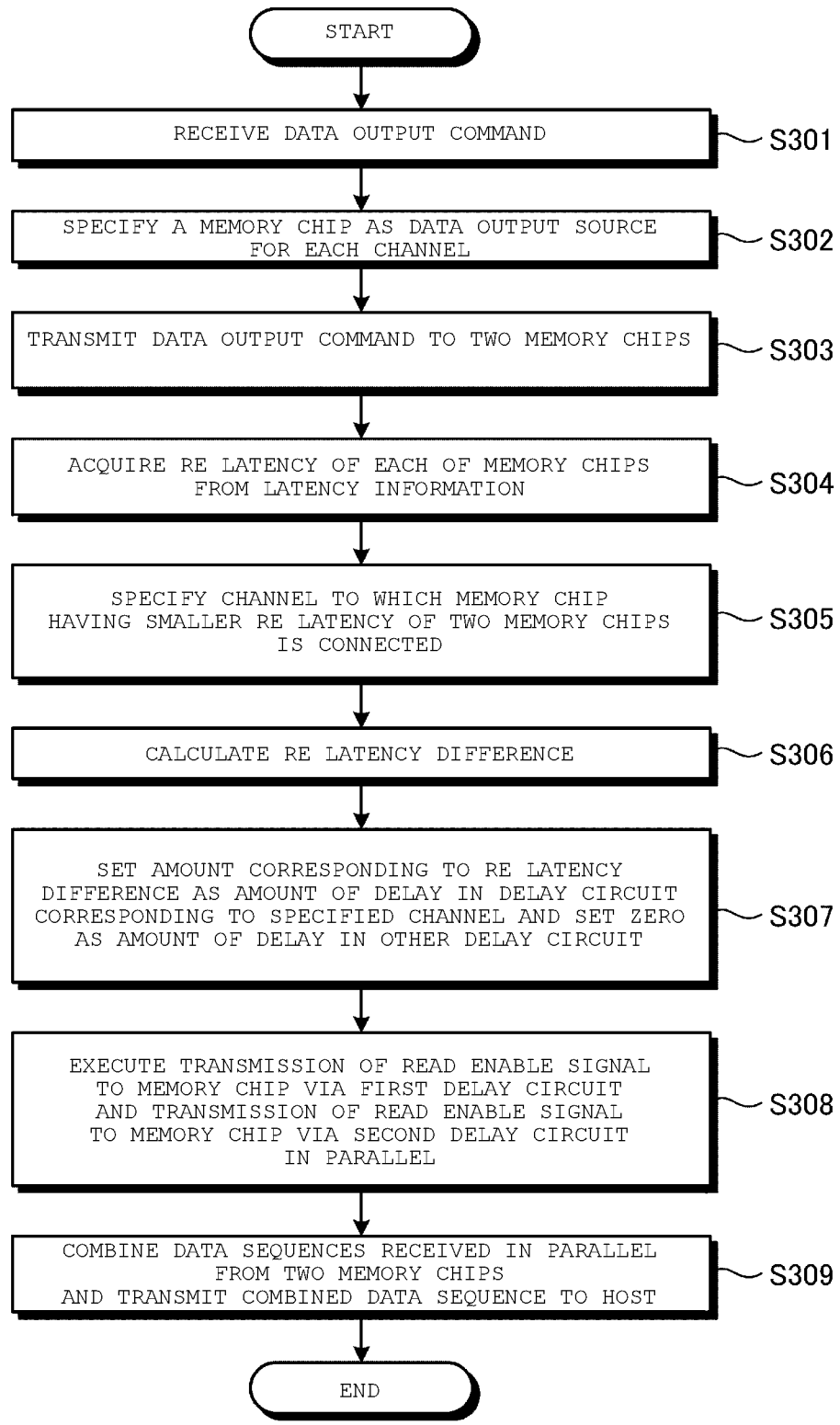
FIG. 5 is a flowchart of a parallel read operation of an embodiment.

FIG. 5 is a flowchart showing an example of the parallel read operation of the embodiment.

When the bridge chip BC receives a data output command from the host HA (S301), the bridge chip BC starts the parallel read operation. In the parallel read operation, the processor 111 first specifies a memory chip CP as the data output source for each channel (S302). The processor 111 specifies one of the four memory chips CP1 connected to the channel CH1 and one of the four memory chips CP2 connected to the channel CH2 as data output sources.

Subsequently, the processor 111 transmits a data output command to each of the two specified memory chips CP (S303).

Subsequently, the processor 111 acquires the RE latencies of the two memory chips CP from the latency information 116 that is stored in the memory 115 (S304). Thereafter, the processor 111 identifies the channel to which the memory chip CP having the smaller RE latency of the two memory chips CP is connected (S305) and calculates the RE latency difference between the two memory chips CP (S306).

Next, the processor 111 sets the amount corresponding to the RE latency difference as the amount of delay in the one of the delay circuits (the first delay circuit 114-1 or the second delay circuit 114-2) corresponding to the channel identified as being connected to the memory chip CP with the smaller RE latency and sets zero as the amount of delay in the other one of the first delay circuit 114-1 or the second delay circuit 114-2 (S307).

When reception of the read enable signal H_REn starts from the host HA, the parallel read control circuit 112 generates a read enable signal REn obtained by dividing the frequency (frequency division) of the read enable signal H_REn by ½ and inputs the read enable signal REn to both the first delay circuit 114-1 and the second delay circuit 114-2. Each of the first delay circuit 114-1 and the second delay circuit 114-2 outputs the read enable signal REn with a delay of a set amount. As a result, the bridge chip BC executes the transmission of the read enable signal REn to the memory chip CP1 via the first delay circuit 114-1 and the read enable signal REn to the memory chip CP2 via the second delay circuit 114-2 in parallel (S308).

When each of the two specified memory chips CP receives the read enable signal REn, the output of the data sequence begins. Each of the two memory chips CP outputs the data strobe signal DQS in synchronization with the output of the data sequence.

The read enable signal REn input to the memory chip CP having the smaller RE latency of the two memory chips CP is delayed by the amount corresponding to the RE latency difference to the other of the two memory chips CP. Therefore, in the bridge chip BC, the timing of reception start of the data sequence from the memory chip CP1 as the data output source and the timing of reception start of the data sequence from the memory chip CP2 as the data output source are approximately equal. The parallel read control circuit 112 combines the data sequences from the two memory chips CP that begin reception at the same time to generate one combined data sequence. And then, the bridge chip BC transmits the generated combined data sequence to the host HA (S309). When the transmission of the data sequence to the host HA is completed, the parallel read operation is ended.

FIG. 6 is a timing chart showing waveforms of various signals in the parallel read operation of an embodiment.

First, the host HA transmits a data output command (S401). In S401, the host HA transmits a command value C1 of a pair of command values C1 and C2 representing the data output command, an address value ADR that represents a location where the data sequence to be output is stored, and a command value C2 of the pair, in this order. When the command values C1 and C2 are transmitted, the host HA maintains the command latch enable signal CLE in the active state (H level) and toggles the write enable signal WEn. When the address value ADR is transmitted, the host HA maintains the address latch enable signal ALE in the active state (H level) and toggles the write enable signal WEn.

When the bridge chip BC receives the data output command, an output command corresponding to the received data output command is transferred in parallel to the two addressed memory chips CP via the channel CH1 and the channel CH2 (S402).

Subsequently, the host HA switches the read enable signal H_REn/RE from the H level to the L level (S403). And after a certain time elapses from the transition of the read enable signal H_REn from the H level to the L level, the toggle of the read enable signal H_REn/RE is started (S404).

In the bridge chip BC, due to the function of the parallel read control circuit 112, the read enable signal H_REn is input to each of the first delay circuit 114-1 and the second delay circuit 114-2 after the toggle frequency thereof is divided by ½. Each of the first delay circuit 114-1 and the second delay circuit 114-2 delays the input read enable signal REn by a set amount of delay and outputs the input read enable signal Ren after the set delay. The read enable signal REn output from the first delay circuit 114-1 is supplied to the channel CH1 as a read enable signal N1_REn. The read enable signal REn output from the second delay circuit 114-2 is supplied to the channel CH2 as a read enable signal N2_REn.

The bridge chip BC switches the read enable signal N1_REn from the H level to the L level according to the transition of the read enable signal H_REn in S403 (S405) and then starts toggle of the read enable signal N1_REn at a frequency of ½ of the read enable signal H_REn in response to the toggle of the read enable signal H_REn in S404 (S406).

Similarly, the bridge chip BC switches the read enable signal N2_REn from the H level to the L level according to the transition of the read enable signal H_REn in S403 (S407) and then starts toggle of the read enable signal N2_REn at a frequency of ½ of the read enable signal H_REn in response to the toggle of the read enable signal H_REn in S404 (S408).

When the toggled read enable signal N1_REn is received, the memory chip CP1 selected as the data output source starts to output the data sequence and toggle the data strobe signal N1_DQS (S409). When the toggled read enable signal N2_REn is received, the memory chip CP2 selected as the data output source starts to output the data sequence and toggle the data strobe signal N2_DQS (S410). Both the memory chip CP1 and the memory chip CP2 selected as the data output sources toggles the data strobe signal DQS at a frequency equal to the frequency of the read enable signal REn respectively received by each of the memory chip CP1 and the memory chip CP2.

In FIG. 6, the period L1 from the toggle start of the read enable signal N1_REn in S406 to the start of the output of the data sequence and the toggle of the data strobe signal N1_DQS in S409 corresponds to the RE latency of the memory chip CP1. The period L2 from the toggle start of the read enable signal N2_REn in S408 to the start of the output of the data sequence and the toggle of the data strobe signal N2_DQS in S410 corresponds to the RE latency of the memory chip CP2.

According to an example shown in FIG. 6, the RE latency L2 of the memory chip CP2 is larger than the RE latency L1 of the memory chip CP1. The amount of delay corresponding to a difference dL between the RE latency L2 and the RE latency L1 is set in the first delay circuit 114-1 as the delay amount, and zero is set as the delay amount in the second delay circuit 114-2. As a result, the time at which the toggle of the read enable signal N1_REn is started when the amount of delay is zero is the time (that is, the timing of S406) delayed by dL as compared with the time of the toggle start of the read enable signal N2_REn (that is, the timing of S408). As a result, the difference dL between the RE latency L2 of the memory chip CP2 and the RE latency L1 of the memory chip CP1 is compensated, and the time at which the two memory chips CP start outputting the data sequences will be equal.

In the bridge chip BC, the reception of data sequences from the two memory chips CP selected as the data output sources starts at the same time. The bridge chip BC combines the data sequences received from the two memory chips CP by using the method described with reference to FIG. 2, for example, and starts the transmission of the one combined data sequence generated by the combining and the toggle of the data strobe signal H_DQS (S411).

In this way, by adjusting the timing of transmission start of the read enable signal N_REn for each channel using the delay circuits 114-1 and 114-2, the bridge chip BC functions to align the time of the reception starts for data sequences from the two memory chips CP. As a result, the bridge chip BC can correctly combine the data sequences from two memory chips CP so that the bridge chip BC can output the expected data to the host HA.

It is noted that in the above, the case where the semiconductor storage device 1 includes two channels CH1 and CH2 as a plurality of channels for connecting the bridge chip BC and the plurality of memory chips CP was described. The semiconductor storage device 1 may include three or more channels as a plurality of channels for connecting the bridge chip BC and the plurality of memory chips CP.

When the semiconductor storage device 1 includes three or more channels as a plurality of channels for connecting the bridge chip BC and the plurality of memory chips CP, in the parallel read operation, the bridge chip BC can receive data sequences in parallel from three or more memory chips CP, each connected to a different channel. By adjusting the timing of transmission start of the read enable signal to the three or more memory chips CP with delay circuits, the bridge chip BC can align the timings of reception start of the data sequences output from the three or more memory chips CP.

More specifically, the bridge chip BC may include a delay circuit for each channel. The processor 111 acquires the maximum value of the measured values of the RE latencies of the three or more memory chips CP selected as the parallel data output sources. The processor 111 sets the difference between the measured value of the RE latency of each of three or more memory chips CP and the maximum value as the amount of delay in the delay circuit corresponding to the channel to which each of the three or more memory chips CP is connected. As a result, the variations in the RE latencies of the three or more memory chips CP as the data output sources can be compensated, and the timings of reception start of the data sequences from the three or more memory chips CP can be aligned.

It is noted that in the above example, the amount of delay corresponding to the difference from the maximum value of the RE latency of each of the memory chips CP as the data output sources is set in the corresponding delay circuit. The method for setting the amount of delay for each delay circuit is not limited to this. The processor 111 may set the amount of delay corresponding to the difference from a fixed value of the RE latency of each of the memory chips CP as the data output sources, in the corresponding delay circuit. The fixed value may be a value larger than the maximum value of the RE latency of each of the memory chips CP as the data output sources.

Furthermore, when the semiconductor storage device 1 includes three or more channels for connecting the bridge chip BC and the plurality of memory chips CP, the parallel read control circuit 112 can combine three or more data sequences received from three or more memory chips CP at the same time and transmit the combined three or more data sequences to the host HA.

More specifically, the parallel read control circuit 112 may sequentially acquire data sequences from three or more memory chips CP in units of the bus widths of the channel and can generate one data sequence by combining the sequentially acquired data in series in units of the bus widths of the channels.

It is noted that the method of combining the data sequences by the parallel read control circuit 112 is not limited to the above. The parallel read control circuit 112 may combine a plurality of data sequences into one sequence using any known method.

When two or more data sequences from two or more memory chips CP are combined, the parallel read control circuit 112 transmits the combined data to the host HA at a transfer rate of N times the transfer rate per channel to which the group of memory chips CP is connected, where N is the number of memory chips CP selected as the parallel data output sources.

As a result, it is possible to improve the transfer rate between the host HA and the semiconductor storage device 1.

It is noted that in some examples the data transfer rate after the combining might not be N times the transfer rate per channel to which the group of memory chips CP is connected.

Furthermore, the bridge chip BC measures the RE latency for each of the memory chips CP in response to the training instruction received from the host HA. But, in some examples, the measurement of the RE latency by the bridge chip BC may be initiated by the bridge chip BC itself rather than by instruction from the host HA.

In the above-described embodiment, the bridge chip BC includes the first delay circuit 114-1 corresponding to the channel CH1 and the second delay circuit 114-2 corresponding to the channel CH2, and each of the first delay circuit 114-1 and the second delay circuit 114-2 is configured such that the amount of delay can be changed. The configuration related to the delay circuits is not limited to this. For example, the amount of delay of one of the first delay circuit 114-1 and the second delay circuit 114-2 may be fixed, and the bridge chip BC may be configured to compensate for the RE latency difference between the two memory chips CP as the data output sources by the other one of the first delay circuit 114-1 and the second delay circuit 114-2. Alternatively, the bridge chip BC may include a single delay circuit and may be configured to compensate for the RE latency difference between the two selected memory chips CP by using just the one delay circuit. For example, when the bridge chip BC includes M (where M is an integer of 2 or more) channels for connecting the bridge chip BC and a plurality of memory chips CP, as long as the bridge chip BC includes M−1 delay circuits in which the amount of delay can be changed, the bridge chip BC can compensate for the RE latency difference between the M memory chips CP. In other words, when the RE latencies of M−1 memory chips CP excluding the memory chip CP having the maximum RE latency among the M memory chips CP as the data output sources can be adjusted, it is possible to align the timings of reception start of the data sequences from the M memory chips CP. In this way, by adjusting the timing of transmission start of the read enable signal REn in units of channels, it is possible to align the timings of reception start of the data sequences from the M memory chips CP selected as the data output sources.

As described above, according to an embodiment, by adjusting the transmission start of the read enable signal REn, which is a timing signal for data output, separately for each channel using a delay circuit, the bridge chip BC can align the timings for the reception of the data sequences output from the two or more memory chips CP.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a bridge chip with an external terminal group configured to be connected to a host; and
a plurality of memory chips including a first memory chip connected to the bridge chip by a first channel and a second memory chip connected to the bridge chip by a second channel, wherein
the bridge chip comprises:
a first delay circuit configured to set a transmission start timing for a first timing signal output to the first memory chip via the first channel, the first timing signal initiating transmission of a data sequence from the first memory chip via the first channel;
a second delay circuit configured to set a transmission start timing for a second timing signal output to the second memory chip via the second channel, the second timing signal initiating transmission of a data sequence from the second memory chip via the second channel; and
a controller configured to:
control at least one of the first and second delay circuits to adjust the transmission start timing of at least one of the first and second timing signals such that the data sequence from the first memory chip and the data sequence from the second memory chip will be aligned in time, and
combine the data sequence from the first memory chip and the data sequence from the second memory chip into an interleaved serial sequence.

2. The semiconductor storage device according to claim 1, wherein the controller is configured to:
measure a read enable latency for each of the first memory chip and the second memory chip,
store the measured read enable latency for each of the first memory chip and the second memory chip, and
control the first and second delay circuits to set the transmission start timings for the first and second timing signals according to the stored read enable latency for each of the first memory chip and the second memory chip.

3. The semiconductor storage device according to claim 2, wherein the controller is further configured to measure the read enable latency for each of the first memory chip and the second memory chip in response to an instruction from the host.

4. The semiconductor storage device according to claim 1, wherein the plurality of memory chips includes a plurality of first memory chips connected to the bridge chip by the first channel and a plurality of second memory chips connected to the bridge chip by the second channel.

5. The semiconductor storage device according to claim 4, wherein the controller is configured to:

measure a read enable latency for each of the first memory chips and each of the second memory chips, store the measured read enable latency for each of the first memory chips and each of the second memory chips, and control the first and second delay circuits to set the transmission start timings for the first and second timing signals according to at least the stored read enable latency for a targeted one of the first memory chips and a targeted one of the second memory chips.

6. The semiconductor storage device according to claim 5, wherein the controller is further configured to measure the read enable latency for each of the first memory chips and the second memory chips in response to an instruction from the host.

7. The semiconductor storage device according to claim 5, wherein the controller is further configured to:

calculate a difference between the measured values of the read enable latency for a targeted first memory chip in the plurality of first memory chips and a targeted second memory chip in the plurality of second memory chips, set the calculated difference as a delay time for the transmission start timing for the first or second timing signal, and set a delay time for the transmission start timing for the other of the first or second timing signal to zero.

8. The semiconductor storage device according to claim 1, wherein the controller is configured to:

measure a read enable latency for the first memory chip and a read enable latency for the second memory chip, calculate a difference between the measured values of the read enable latency for the first memory chip and the second memory chip, set the calculated difference as a delay time for the transmission start timing for the first or second timing signal, and set a delay time for the transmission start timing for the other of the first or second timing signal to zero.

9. The semiconductor storage device according to claim 1, wherein the interleaved serial sequence is transmitted to the host via a third channel at a frequency that is at least twice a frequency of the transmission of the data sequence from the first memory chip via the first channel.

10. The semiconductor storage device according to claim 1, wherein the controller is configured to transmit, in response to a data output command from the host, a read enable signal to the first memory chip via the first delay circuit in parallel with a read enable signal to the second memory chip via the second delay circuit.

11. A memory system, comprising:

a host device; and a semiconductor storage device connected to the host device by a host channel, the semiconductor storage device including:

a bridge chip with an external terminal group connected to the host channel; and a plurality of memory chips including a first memory chip connected to the bridge chip by a first channel and a second memory chip connected to the bridge chip by a second channel, wherein the bridge chip comprises:

a first delay circuit configured to set a transmission start timing for a first timing signal output to the first memory chip via the first channel, the first timing signal initiating transmission of a data sequence from the first memory chip via the first channel;

a second delay circuit configured to set a transmission start timing for a second timing signal output to the second memory chip via the second channel, the second timing signal initiating transmission of a data sequence from the second memory chip via the second channel; and a controller configured to:

control at least one of the first and second delay circuits to adjust the transmission start timing of at least one of the first and second timing signals such that the data sequence from the first memory chip and the data sequence from the second memory chip will be aligned in time, combine the data sequence from the first memory chip and the data sequence from the second memory chip into an interleaved serial sequence, and transmit the interleaved serial sequence to the host device via the host channel.

12. The memory system according to claim 11, wherein the controller is configured to:

measure a read enable latency for each of the first memory chip and the second memory chip, store the measured read enable latency for each of the first memory chip and the second memory chip, and control the first and second delay circuits to set the transmission start timings for the first and second timing signals according to the stored read enable latency for each of the first memory chip and the second memory chip.

13. The memory system according to claim 12, wherein the controller is further configured to measure the read enable latency for each of the first memory chip and the second memory chip in response to an instruction from the host device.

14. The memory system according to claim 11, wherein the plurality of memory chips includes a plurality of first memory chips connected to the bridge chip by the first channel and a plurality of second memory chips connected to the bridge chip by the second channel.

15. The memory system according to claim 14, wherein the controller is configured to:

measure a read enable latency for each of the first memory chips and each of the second memory chips, store the measured read enable latency for each of the first memory chips and each of the second memory chips, and control the first and second delay circuits to set the transmission start timings for the first and second timing signals according to at least the stored read enable latency for a targeted one of the first memory chips and a targeted one of the second memory chips.

16. The memory system according to claim 15, wherein the controller is further configured to measure the read enable latency for each of the first memory chips and the second memory chips in response to an instruction from the host device.

17. The memory system according to claim 11, wherein the interleaved serial sequence is transmitted to the host device via the host channel at a frequency that is at least twice a frequency of the transmission of the data sequence from the first memory chip via the first channel.

18. The memory system according to claim 11, wherein the controller is configured to transmit, in response to a data output command from the host device, a read enable signal to the first memory chip via the first delay circuit in parallel with a read enable signal to the second memory chip via the second delay circuit.

19. A method for controlling parallel read operations of a semiconductor storage device including a plurality of memory chips connected to a bridge chip by a plurality of channels, the method comprising:

setting a transmission start timing for a first timing signal output to a first memory chip via a first channel based on a read enable latency for the first memory chip, the first timing signal initiating transmission of a data sequence from the first memory chip via the first channel; and setting a transmission start timing for a second timing signal output to a second memory chip via a second channel based on a read enable latency for the second memory chip, the second timing signal initiating transmission of a data sequence from the second memory chip via the second channel, wherein at least one of the first and second timing signals is set such that the data sequence from the first memory chip and the data sequence from the second memory chip will be aligned in time.

20. The method according to claim 19, further comprising:

combining the data sequence from the first memory chip and the data sequence from the second memory chip into an interleaved serial sequence; and transmitting the interleaved serial sequence to a host device via a third channel.

* * * * *